United States Patent
Kamei et al.

(10) Patent No.: US 6,922,357 B2
(45) Date of Patent: Jul. 26, 2005

(54) NON-VOLATILE SEMICONDUCTOR MEMORY DEVICE

(75) Inventors: Teruhiko Kamei, Yokohama (JP); Masahiro Kanai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 149 days.

(21) Appl. No.: 10/377,707

(22) Filed: Mar. 4, 2003

(65) Prior Publication Data

US 2003/0198102 A1 Oct. 23, 2003

(30) Foreign Application Priority Data

Mar. 15, 2002 (JP) ........................................ 2002-071808

(51) Int. Cl.⁷ ............................................... G11C 16/04
(52) U.S. Cl. .............................. 365/185.05; 365/185.11; 365/185.18; 365/185.24
(58) Field of Search ....................... 365/185.05, 185.18, 365/185.24, 185.11

(56) References Cited

U.S. PATENT DOCUMENTS

| | | | |
|---|---|---|---|
| 5,408,115 A | 4/1995 | Chang | |
| 5,422,504 A | 6/1995 | Chang et al. | |
| 5,494,838 A | 2/1996 | Chang et al. | |
| 5,969,383 A | 10/1999 | Chang et al. | |
| 6,177,318 B1 | 1/2001 | Ogura et al. | |
| 6,248,633 B1 | 6/2001 | Ogura et al. | |
| 6,255,166 B1 | 7/2001 | Ogura et al. | |
| 6,549,463 B2 * | 4/2003 | Ogura et al. ........... | 365/185.18 |
| 6,587,380 B2 | 7/2003 | Kanai et al. | |
| 6,587,381 B2 * | 7/2003 | Kanai et al. ........... | 365/185.28 |
| 6,646,916 B2 | 11/2003 | Kamei | |
| 6,650,591 B2 | 11/2003 | Owa | |
| 6,654,282 B2 | 11/2003 | Kanai | |
| 6,686,632 B2 * | 2/2004 | Ogura et al. ................ | 257/374 |
| 6,697,280 B2 | 2/2004 | Natori | |
| 6,704,224 B2 | 3/2004 | Natori | |
| 6,707,695 B2 | 3/2004 | Owa | |
| 6,707,716 B2 | 3/2004 | Natori | |
| 6,707,720 B2 | 3/2004 | Kamei et al. | |
| 6,707,742 B2 | 3/2004 | Kamei et al. | |
| 6,710,399 B2 | 3/2004 | Kamei | |
| 6,717,854 B2 | 4/2004 | Natori | |
| 6,738,291 B2 | 5/2004 | Kamei et al. | |
| 6,744,106 B2 | 6/2004 | Kanai | |
| 6,757,197 B2 | 6/2004 | Kamei | |
| 6,760,253 B2 | 7/2004 | Kamei | |
| 6,778,446 B2 | 8/2004 | Natori | |
| 6,781,187 B2 | 8/2004 | Owa | |
| 6,785,182 B2 | 8/2004 | Kamei et al. | |

FOREIGN PATENT DOCUMENTS

| | | |
|---|---|---|
| JP | H07-161851 | 6/1995 |
| JP | 2978477 | 9/1999 |
| JP | 2001-156188 | 6/2001 |

OTHER PUBLICATIONS

Yutaka Hayashi et al., "Twin MONOS Cell With Dual Control Gates", 2000, IEEE VLSI Technology Digest.

Kuo–Tung Chang et al., "A New SONOS Memory Using Source–Side Injection for Programming", IEEE Electron Device Letters, vol. 19, No. 7, Jul. 1998, pp. 253–255.

Wei–Ming Chen et al., "A Novel Flash Memory Device With S Plit Gate Source Side Injection and ONO Charge Storage Stack (SPIN)", 1997, VLSI Technology Digest, pp. 63–64.

(Continued)

*Primary Examiner*—Son T. Dinh
(74) *Attorney, Agent, or Firm*—Oliff & Berridge, PLC

(57) ABSTRACT

A non-volatile semiconductor memory device enabling reading at high speed has a memory cell array including a plurality of memory cells arranged in a column direction and a row direction, each of the memory cells having first and second non-volatile memory elements that are controlled by one word gate and first and second control gates. One of the first and second non-volatile memory elements stores data, but the other does not function as an element which stores data.

11 Claims, 9 Drawing Sheets

OTHER PUBLICATIONS

U.S. Appl. No. 10/115,956, filed Apr. 5, 2002, Publication No. 2003–0072191.

U.S. Appl. No. 10/157,897, filed May 31, 2002, Publication No. 2003–0072194.

U.S. Appl. No. 10/193,066, filed Jul. 12, 2002, Publication No. 2003–0025149.

U.S. Appl. No. 10/193,602, filed Jul. 12, 2002, Publication No. 2003–0027411.

U.S. Appl. No. 10/197,643, filed Jul. 18, 2002, Publication No. 2003–0025150.

U.S. Appl. No. 10/246,708, filed Sep. 19, 2002, Publication No. 2003–0095443.

U.S. Appl. No. 10/373,166, filed Feb. 26, 2003, Publication No. 2003–0174558.

U.S. Appl. No. 10/385,506, filed Mar. 12, 2003, Publication No. 2003–0198103.

* cited by examiner

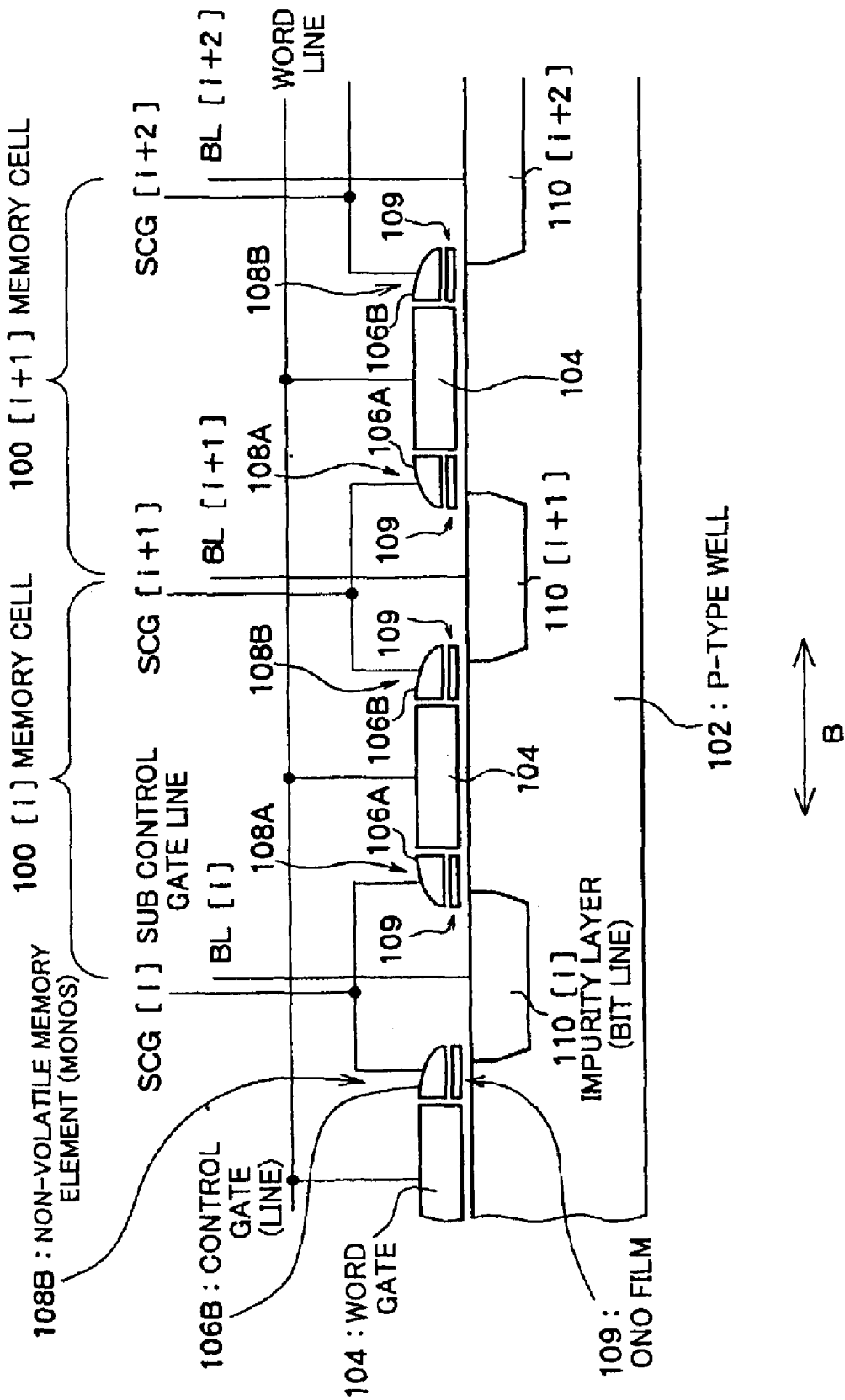

NON-VOLATILE SEMICONDUCTOR MEMORY DEVICE

Japanese Patent Application No. 2002-71808, filed on Mar. 15, 2002, is hereby incorporated by reference in its entirety.

BACKGROUND OF THE INVENTION

The present invention relates to a non-volatile semiconductor memory device having non-volatile memory elements controlled by control gates.

As an example of a non-volatile semiconductor memory device, a MONOS (Metal-Oxide-Nitride-Oxide-Semiconductor or -Substrate) non-volatile semiconductor memory device is known. In the MONOS non-volatile semiconductor memory device, a gate insulating layer between a channel and a gate is formed of a laminate consisting of a silicon oxide film, a silicon nitride film, and a silicon oxide film, and electric charge is trapped in the silicon nitride film.

The MONOS non-volatile semiconductor memory device was disclosed by Y. Hayashi, et al, in 2000 Symposium on VLSI Technology Digest of Technical Papers, pp. 122–123. This literature discloses a MONOS flash memory cell including two non-volatile memory elements (MONOS memory elements) controlled by one word gate and two control gates. Specifically, one flash memory cell has two charge trap sites, and two bits of data are stored in one cell.

A memory cell array is formed by arranging a plurality of MONOS flash memory cells having such a structure in a row direction and a column direction.

A case where one of the memory elements of the memory cell is a selected cell and the other memory element is a non-selected cell (hereinafter called "opposite cell") is described below. When reading data from the selected cell, a select voltage is supplied to the control gate of the selected cell and an override voltage is supplied to the control gate of the opposite cell. 0 V is supplied to the control gates of the non-selected cells other than the opposite cell.

The override voltage is a voltage necessary for allowing a read current or a program current to flow by causing a transistor of the opposite cell to be turned on irrespective of the presence or absence of a program in the opposite cell.

The override voltage when reading data and the select voltage and the override voltage when programming data are higher than a power supply voltage. These voltages are supplied from a booster circuit.

As a conventional problem in this type of non-volatile semiconductor memory device, it is necessary to increase the speed of read operation. However, a considerable period of time is needed to raise the voltage of the control gate line from 0 V to a final voltage.

BRIEF SUMMARY OF THE INVENTION

The present invention may provide a non-volatile semiconductor memory device enabling reading at high speed.

According to the present invention there is provided a non-volatile semiconductor memory device comprising:

a memory cell array including a plurality of memory cells arranged in a column direction and a row direction, each of the memory cells having first and second non-volatile memory elements that are controlled by one word gate and first and second control gates, wherein:

one of the first and second non-volatile memory elements stores data; and the other of the first and second non-volatile memory elements stores no data.

In this configuration, a voltage to be applied to one of the first and second control gates of the non-volatile memory element (or non-selected opposite cell) having no data in data reading is not required to be an override voltage. In other words, it suffices that this voltage to be applied is higher than a threshold voltage in a state in which the memory element has no electric charge. Therefore, it suffices that the voltage to be applied is much lower than the override voltage, enabling to lower the voltage. As a result, power consumption can be reduced. Moreover, rise time of the voltage of the first and second control gates can be shortened, whereby reading at high speed can be achieved.

In a data read mode, one of the first and second non-volatile memory elements in each of the memory cells may be a selected cell and the other of the first and second non-volatile memory elements may be a non-selected opposite cell; and a voltage equal to or lower than a power supply voltage may be supplied to both the selected cell and the non-selected opposite cell. In this case, a select voltage may be applied to the control gates of both the selected cell and the non-selected opposite cell.

It is thus unnecessary to apply a boosted voltage to one of the first and second control gates when data is read. After entering a read mode in response to a chip enable signal, the time up to the start of reading operation can be shortened in comparison with the case where a boosted voltage is necessary. Therefore, reading at high speed can be achieved. Moreover, since a boosted voltage is unnecessary when reading, power consumption can be reduced.

A bit line may be connected to each of the first and second non-volatile memory elements;

the non-volatile semiconductor memory device may further comprise a driver circuit which generates a drive voltage for driving the word gate, the first and second control gates, and the bit line; and the driver circuit may generate the drive voltage which is equal to or lower than a power supply voltage in a data read mode.

This non-volatile semiconductor memory device may further comprise a bit line connected in common to adjacent first and second non-volatile memory elements respectively belonged to two of the memory cells which are adjacent to each other in the row direction, the bit line extending in the column direction. In this case, the adjacent first and second non-volatile memory elements in the two memory cells share a single bit line.

The same data may be stored in each of the adjacent first and second non-volatile memory elements in the adjacent two memory cells. This enables to increase the amount of current flowing through the bit line when data is read. Each of the bit lines may be fixed to either a source side or a drain side, and the bit line connected in common to the adjacent two memory cells may function as a drain line.

In this non-volatile semiconductor memory device, the memory cell array may be divided into a plurality of blocks in the column direction; a main bit line may be provided across the plurality of blocks; the bit line may be provided in each of the blocks; a switching element which connects and disconnects the bit line in each of the blocks and the main bit line may be provided; and a voltage which drives the switching element when data is read may be equal to or lower than the power supply voltage.

Each of the first and second non-volatile memory elements may have an ONO film formed of an oxide film (O), a nitride film (N), and an oxide film (O) as a charge trap site. Note that trap structures other than the above trap site can be employed.

In this non-volatile semiconductor memory device, each of the memory cells having the first and second non-volatile memory elements may store one bit data.

BRIEF DESCRIPTION OF THE SEVERAL VIEWS OF THE DRAWING

FIG. 1 is a cross-sectional view showing memory cells used in a non-volatile semiconductor memory device according to one embodiment of the present invention.

DETAILED DESCRIPTION OF THE EMBODIMENT

Figure 2A:
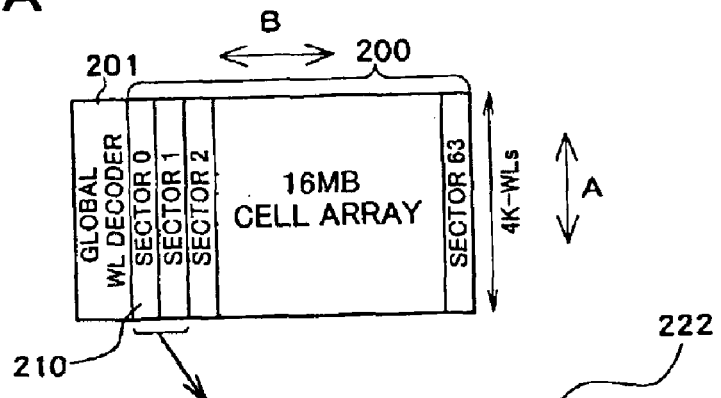
FIG. 2A is a plan view of the layout of the entire non-volatile semiconductor memory device of FIG. 1.

Embodiments of the present invention will be described below with reference to the drawings.
Memory Cell FIG. 1 shows a cross section of a non-volatile semiconductor memory device. In FIG. 1, one memory cell 100 includes a word gate 104 which is formed of a material containing polysilicon or the like on a P-type well 102 through a gate oxide film, first and second control gates 106A and 106B, and first and second non-volatile memory elements (MONOS memory elements) 108A and 108B.

The first and second control gates 106A and 106B are formed on opposite sidewalls of the word gate 104. The first and second control gates 106A and 106B are electrically insulated from the word gate 104.

Each of the first and second non-volatile memory elements 108A and 108B is formed by stacking an oxide film (O), a nitride film (N), and an oxide film (O) between one of the first and second control gates 106A and 106B formed of polysilicon, which corresponds to M (Metal) of MONOS, and the P-type well 102. The first and second control gates 106A and 106B may be formed of a conductive material such as a silicide.

As described above, one memory cell 100 includes the first and second MONOS memory elements 108A and 108B having split gates (first and second control gates 106A and 106B). One word gate 104 is shared by the first and second MONOS memory elements 108A and 108B.

The first and second MONOS memory elements 108A and 108B originally function as charge trap sites.

Specifically, each of the first and second MONOS memory elements 108A and 108B is capable of trapping electric charge in the ONO film 109. The non-volatile semiconductor memory device in the embodiment of the present invention is used in a state in which data is stored in only one of the MONOS memory elements and data is not written in the other MONOS memory element when programming. In other words, only one of the memory elements of one memory cell is a target of data storage, and one memory cell stores one bit of information.

As shown in FIG. 1, the word gates 104 arranged at intervals in a row direction B are connected in common with one word line WL formed of a polycide or the like.

The control gates 106A and 106B shown in FIG. 1 extend along a column direction (direction perpendicular to the surface of FIG. 1) and are shared by the memory cells 100 arranged in the column direction. Therefore, the control gates 106A and 106B are also referred to as control gate lines.

A sub control gate line SCG [i+1] formed of a metal layer located in a layer higher than the word gate, control gate, and word line is connected with the control gate line 106B of the [i]th memory cell 100 [i] and the control gate line 106A of the [i+1]th memory cell 100 [i+1].

An [i+1]th impurity layer 110 [i+1] which is shared by the MONOS memory element 108B of the [i]th memory cell 100 [i] and the MONOS memory element 108A of the [i+1]th memory cell 100 [i+1] is formed in the P-type well 102.

The impurity layers 110 [i], [i+1], and [i+2] are N-type impurity layers formed in the P-type well, for example. The impurity layers 110 [i], [i+1], and [i+2] function as bit lines which extend along the column direction (direction perpendicular to the surface of FIG. 1) and are shared by the memory cells 100 arranged in the column direction. Therefore, the impurity layers 110 [i], [i+1], and [i+2] are also referred to as bit lines BL [i], [i+1], and [i+2].
Non-Volatile Semiconductor Memory Device The entire configuration of the non-volatile semiconductor memory device formed by using the memory cells 100 is described below with reference to FIGS. 2A to 2E.

FIG. 2A is a view showing a planar layout of one chip of the non-volatile semiconductor memory device. The non-volatile semiconductor memory device includes a memory cell array 200 and a global word line decoder 201. The memory cell array 200 has 0th to 63rd (64 in total) sector regions 210, for example.

As shown in FIG. 2A, the 64 sector regions 210 are formed by dividing the memory cell array 200 in the row direction B. Each sector region 210 has a rectangular shape in which the column direction A is the longitudinal direction. The sector region 210 is a minimum unit of data erasure. Data stored in the sector region 210 is erased either collectively or by time division.

The memory cell array 200 has 4K word lines WL and 4K bit lines BL, for example. In the present embodiment, since a pair of the MONOS memory elements 108A and 108B is connected with one bit line BL, the 4K bit lines BL mean a storage capacity of 4K bits. The storage capacity of each sector region 210 is 1/64 of the storage capacity of the entire memory. Each sector region 210 has a storage capacity defined by: (4K word lines WL)×(64 bit lines BL).

Figure 2B:
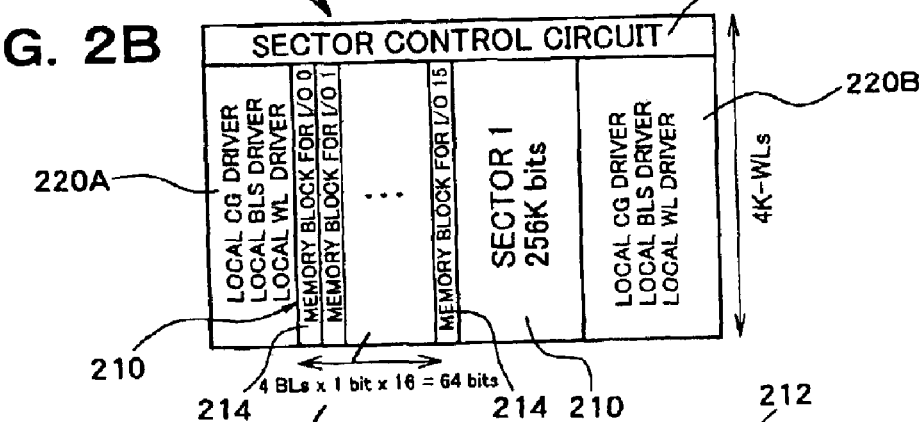
FIG. 2B is a plan view of one sector region shown in FIG. 2A.

FIG. 2B shows details of the adjacent 0th and first sector regions 210 of the non-volatile semiconductor memory device shown in FIG. 2A. As shown in FIG. 2B, local drivers (including a local control gate driver, local bit line select driver, and local word line driver) 220A and 220B are disposed on opposite sides of the two sector regions 210. A sector control circuit 222 is disposed on the upper side of the two sector regions 210 and the local drivers 220A and 220B, for example.

Each sector region 210 is divided in the row direction and has 16 memory blocks 214 for I/O0 to I/O15 (memory blocks corresponding to input/output bits) so that 16-bit data can be read out or written in. Each memory block 214 has 4K (4096) word lines WL, as shown in FIG. 2B.

Figures 2C, 2D, 2E:
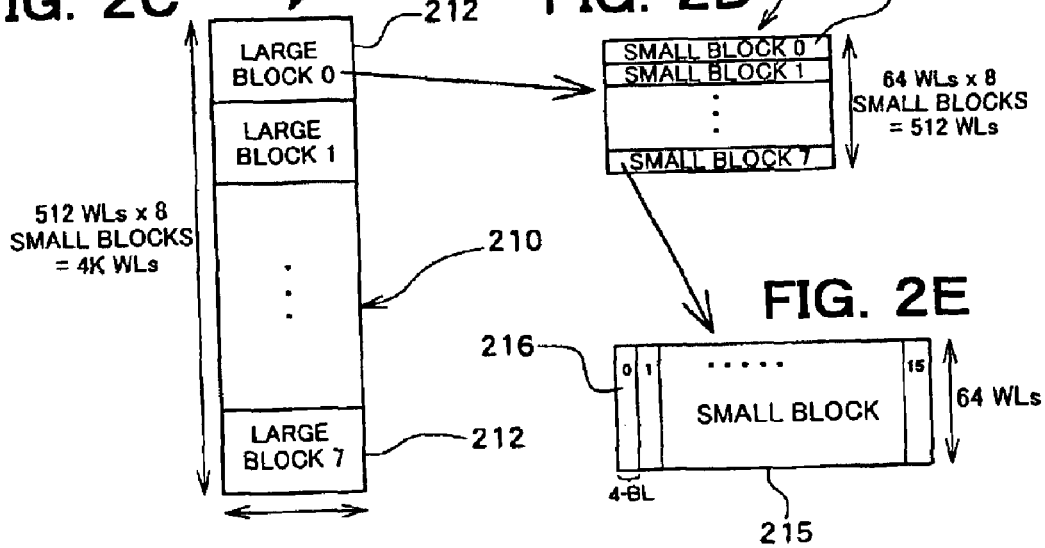
FIG. 2C is a plan view of one memory block shown in FIG. 2B.
FIG. 2D is a plan view of one large block shown in FIG. 2C.
FIG. 2E is a plan view of one small block shown in FIG. 2D.

As shown in FIG. 2C, each sector region 210 shown in FIG. 2B is divided into eight large blocks 212 in the column direction A. Each of the large blocks 212 is divided into eight small blocks 215 in the column direction A, as shown in FIG. 2D.

Each of the small blocks 215 has 64 word lines WL, as shown in FIG. 2E.

Sector Region

Figure 3:
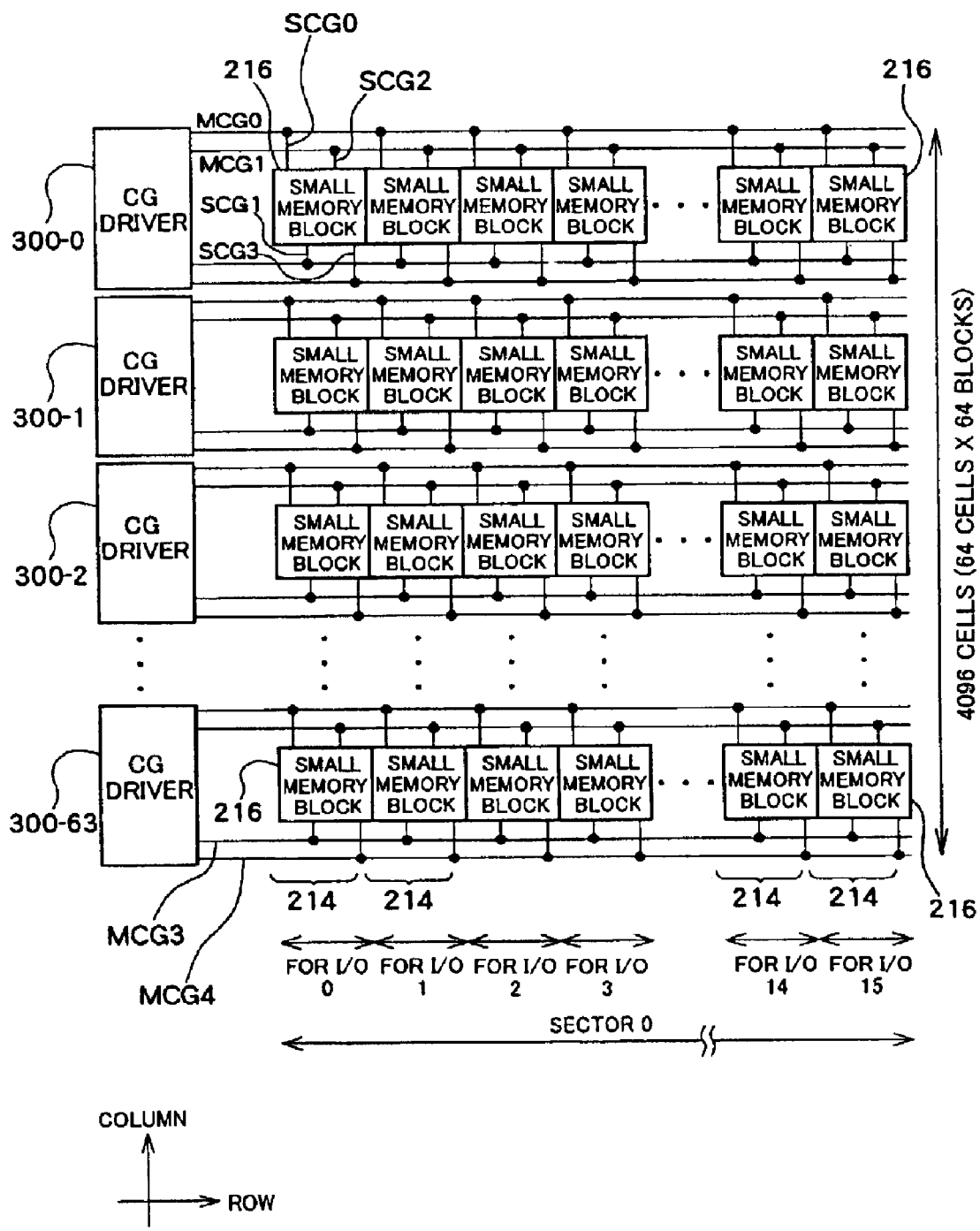
FIG. 3 is a schematic view that is illustrative of small memory blocks and associated wiring within one sector region of FIG. 2B.
Figure 4:
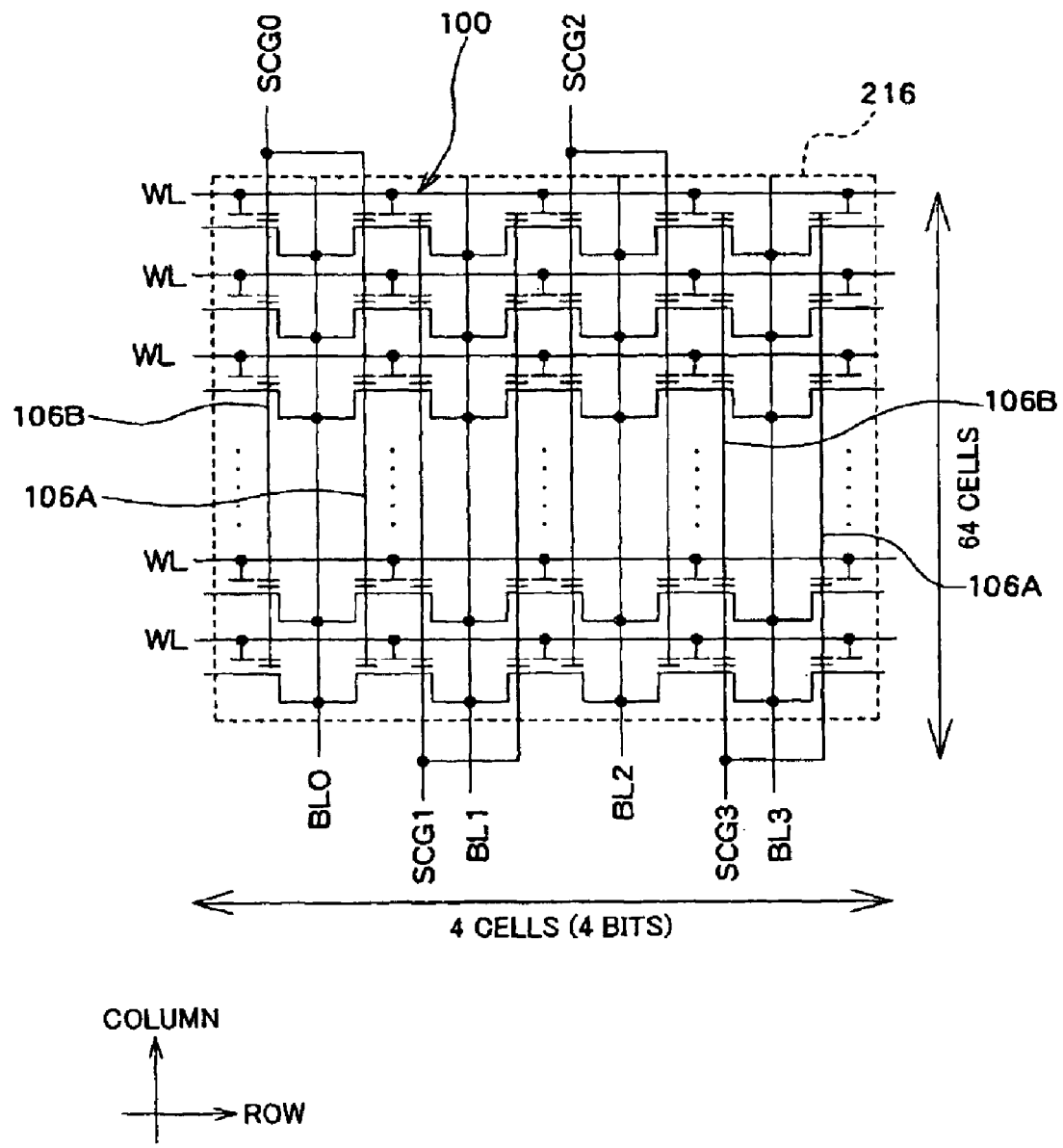
FIG. 4 is a circuit diagram of the small memory blocks shown in FIG. 3.

FIG. 3 is a view showing details of the sector region 0 shown in FIG. 2A. In the small memory block 216 shown in FIG. 3, 64×4 memory cells 100 are arranged in the column direction and the row direction as shown in FIG. 4, for example. Four sub control gate lines SCG0 to SCG3, four bit lines BL0 to BL3 which are data input/output lines, and 64 word lines WL are connected with one small memory block 216.

The second control gates 106B of a plurality of memory cells in the even-numbered column (0th column or second column) and the first control gates 106A of a plurality of memory cells in the odd-numbered column (first column or third column) are connected in common with the even-numbered sub control gate lines SCG0 and SCG2. The second control gates 106B of a plurality of memory cells in the odd-numbered column (first column or third column) and the first control gates 106A of a plurality of memory cells in the even-numbered column (second column or fourth column) are connected in common with the odd-numbered sub control gate lines SCG1 and SCG3.

As shown in FIG. 3, 64 small memory blocks 216 are arranged in one memory block 214 in the column direction. 16 memory blocks 214 are arranged in the row direction corresponding to I/O0 to I/O15 for performing 16-bit input/output.

16 sub control gate lines SCG0 of 16 small memory blocks 216 arranged in the row direction are connected in common with a main control gate line MCG0 in the row direction. 16 sub control gate lines SCG1 are connected in common with a main control gate line MCG1. 16 sub control gate lines SCG2 are connected in common with a main control gate line MCG2. 16 sub control gate lines SCG3 are connected in common with a main control gate line MCG3.

CG drivers 300-0 to 300-63 which are control gate driver sections are provided in the sector region 0. Four main control gate lines MCG0 to MCG3 extending in the row direction are connected with the CG driver 300.

Operation

Figure 5:
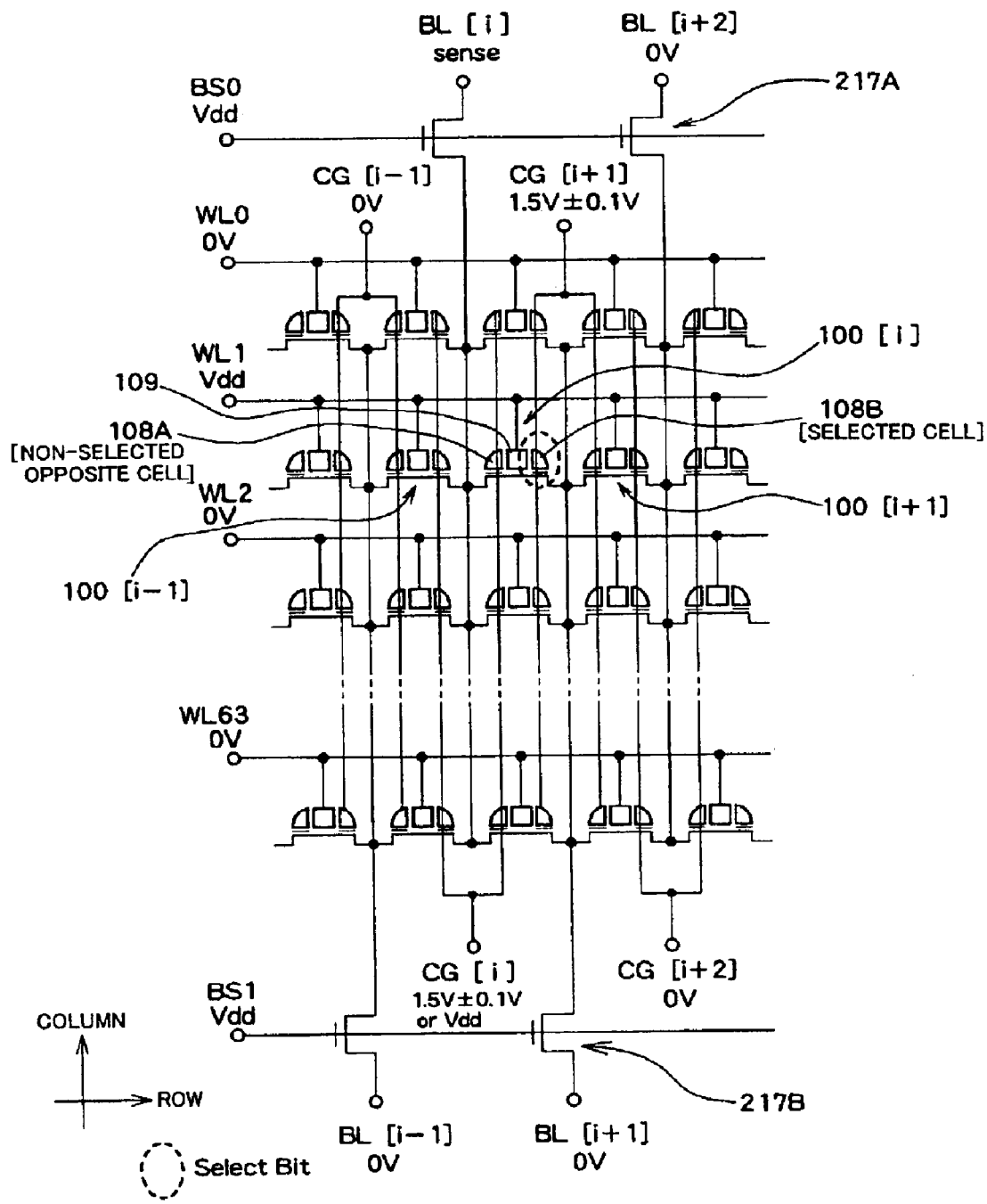
FIG. 5 is a schematic view that is illustrative of voltage setting in a selected block when data is read.

A data read operation, data program operation, and data erase operation of the non-volatile memory in the present embodiment are described below. FIG. 5 is a schematic explanatory diagram for describing the voltage setting in one small memory block 216 when reading data.

A selected cells of the non-volatile memory consists of the memory element 108A or 108B on a selected side (selected cell) and the memory element 108A or 108B on an opposite side (non-selected opposite cell). In more detail, the memory element on the selected side is a target of data storage, and data is not programmed in the memory element on the opposite side when programming.

Bit line select switches 217A and 217B shown in FIG. 5 are described below. As shown in FIGS. 2C, 2D, and 3, the memory cell array 200 is divided into a plurality of blocks in the column direction. As shown in FIG. 2D, the memory cell array 200 is divided into eight large blocks 212, and each of the large blocks 212 is divided into eight small blocks 215. Each of the small blocks 215 is divided into eight small memory blocks 216. FIG. 5 shows one of the small memory blocks 216 divided in the column direction. The bit lines BL are provided in the small memory block 216 along the column direction. A main bit line (not shown) is provided across all the large blocks 212 in the column direction shown in FIG. 2C. The bit line select switches 217A and 217B are switching elements which connect/disconnect each of the bit lines BL in the small memory block 216 and the main bit line (not shown). The bit line select switches 217A and 217B are switched by the potential of the bit select signal line BS.

The potentials of the control gate line CG, bit line BL, word line WL, and the like when reading, programming, and erasing are shown in Table 1.

TABLE 1

| | | | Selected Block | | | |
| | | | Selected MONOS Cell | | | |
| | | | Selected Cell | | Opposite Cell | |
| Mode | BS | WL | BL | CG | BL | CG |
| --- | --- | --- | --- | --- | --- | --- |
| Read | Vdd | Vdd | 0 V | 1.5 ± 0.1 V | sense | 1.5 ± 0.1 V or Vdd |
| Program | 8 V | about 1 V | 5 V | 5.5 V | Iprg = 5 μA (0 to 1 V) | 2.5 V or 1.5 ± 0.1 V or Vdd |
| Erase | 8 V | 0 V | 4.5 to 5 V | −1 to −3 V | 4.5 to 5 V | −1 to −3 V |

Figure 6:
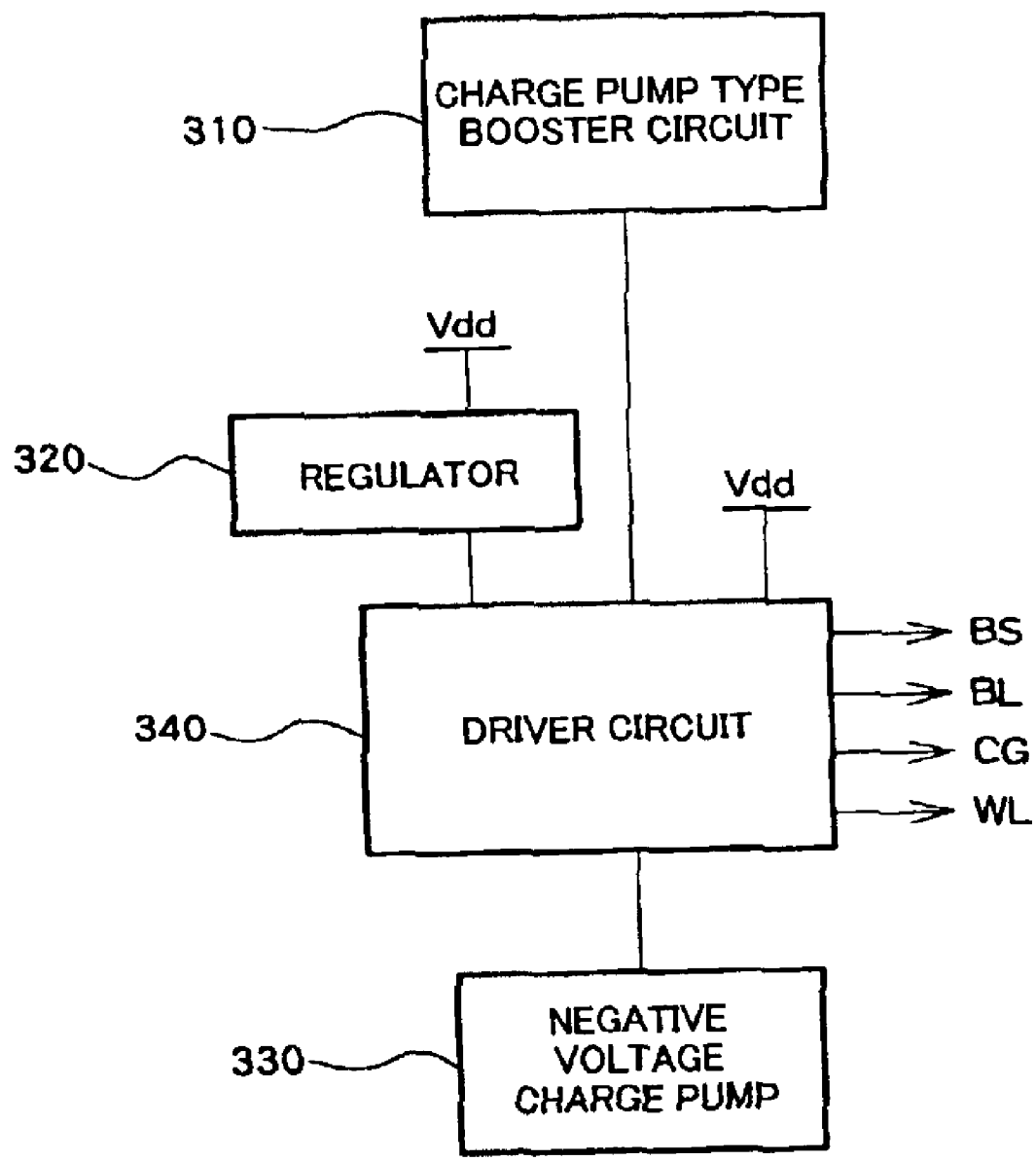
FIG. 6 is a block diagram showing a driver circuit.

The above potentials are supplied from a driver circuit 340. In more detail, predetermined voltages are supplied to each point of the bit select signal line BS, bit line BL, control gate CG, and word line WL from the driver circuit 340, as shown in FIG. 6. The predetermined voltages include a power supply voltage Vdd, voltages generated based on a charge pump type booster circuit 310 (8 V, 5.5 V, 2.5 V, 8 V, and 4.5 to 5 V), voltages generated based on a regulator 320 (1.5 V and about 1 V), and voltages generated based on a negative voltage charge pump 330 (−1 V to −3 V).

Effect

The following effects are obtained by allowing data to be stored in one of the memory elements of the memory cell and not written in the other memory element.

Figure 7:
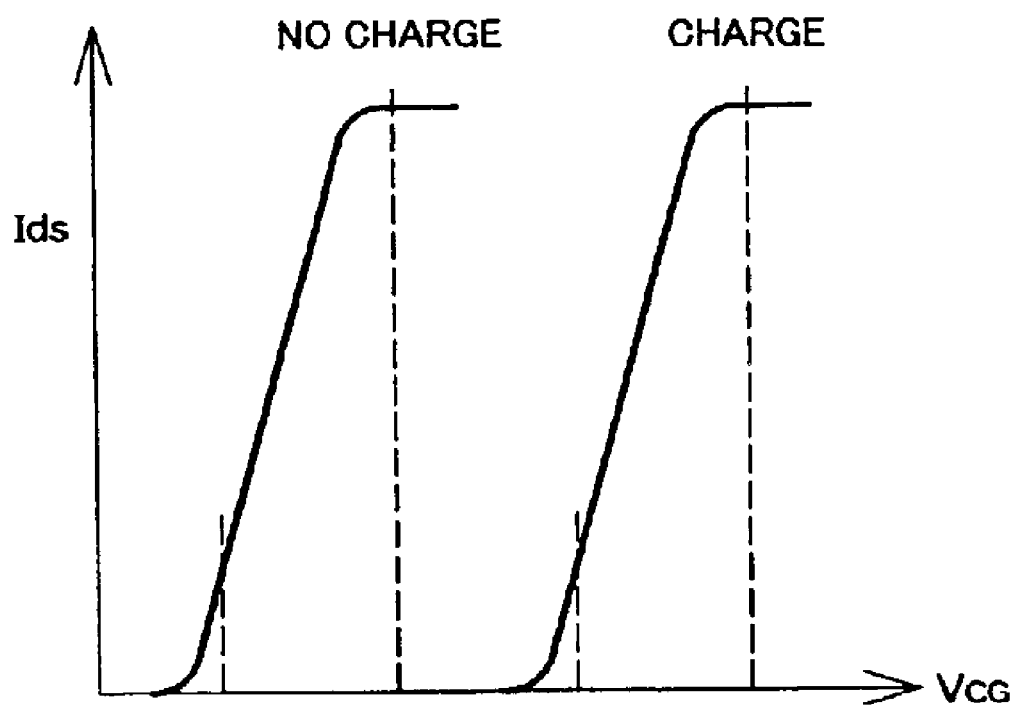
FIG. 7 is a characteristic chart showing the relationship between a voltage (VCG) and the source-drain current (Ids) for describing effects.

In the case of reading data from the memory element on the selected side, voltage must be applied to the control gate of the memory element on the opposite side (non-selected opposite cell). As shown in FIG. 7, in the case where data is not stored (electric charge is not stored) in the non-selected opposite cell, it suffices that the voltage applied to the non-selected opposite cell be lower than that in the case where data is stored (electric charge is stored). As shown in Table 1, it suffices that the voltage applied to the non-selected opposite cell be a voltage higher than a threshold voltage in a state in which electric charge is not stored in the non-selected opposite cell, such as a select voltage. In the case where the threshold voltage is equal to or lower than the power supply voltage, it suffices that the voltage applied to the control gate of the opposite cell be the power supply voltage Vdd, as shown in Table 1. As a result, in the case where the threshold voltage is equal to or lower than the power supply voltage, it is unnecessary to generate a voltage boosted by using a charge pump when applying voltage to the control gate of the memory element on the opposite side when reading. Therefore, the memory cell can be driven at a voltage equal to or lower than the power supply voltage.

Figure 8:
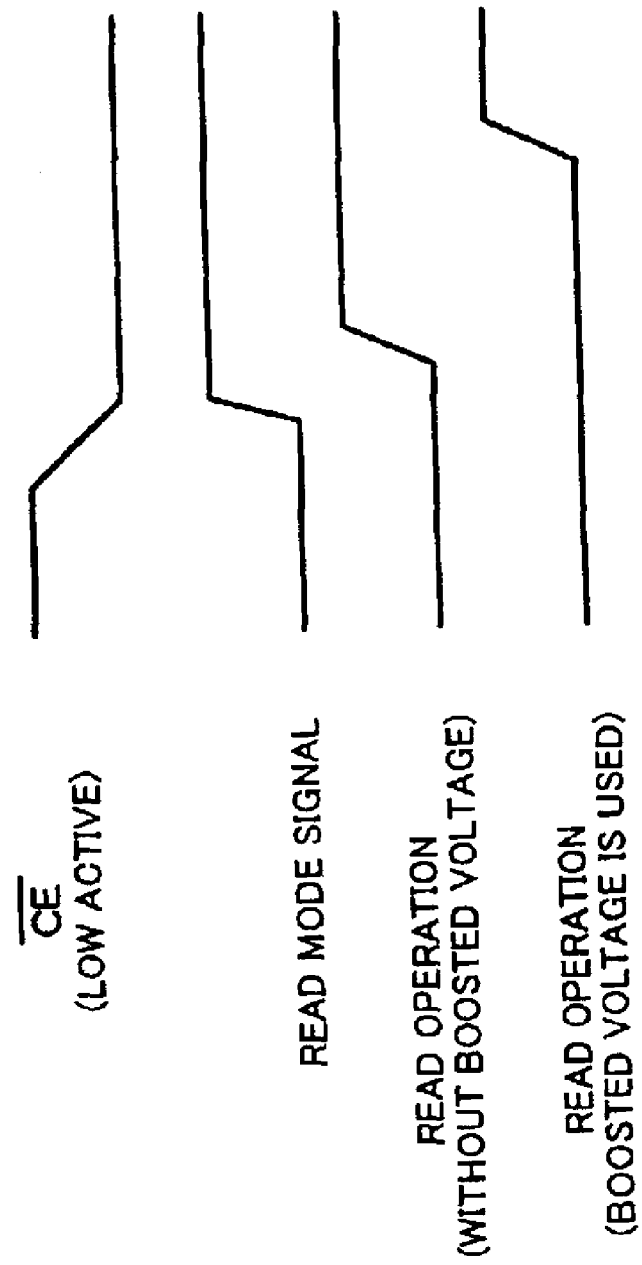
FIG. 8 is a timing chart for describing effects.

This eliminates the need to use a voltage generated based on the charge pump type booster circuit 310 shown in FIG. 6 when reading data, whereby the memory cell can be driven based only on the power supply voltage Vdd and the voltage generated based on the regulator. As a result, a period of time until the read operation starts after entering the read mode in response to a chip enable signal can be decreased in comparison with the case where the boosted voltage is necessary, as shown in FIG. 8. Therefore, reading at high speed can be realized. Moreover, since the boosted voltage is unnecessary when reading, power consumption can be reduced.

Note that the present invention is not limited to the above-described embodiment, and various modifications can be made within the scope of the invention.

Figure 9:
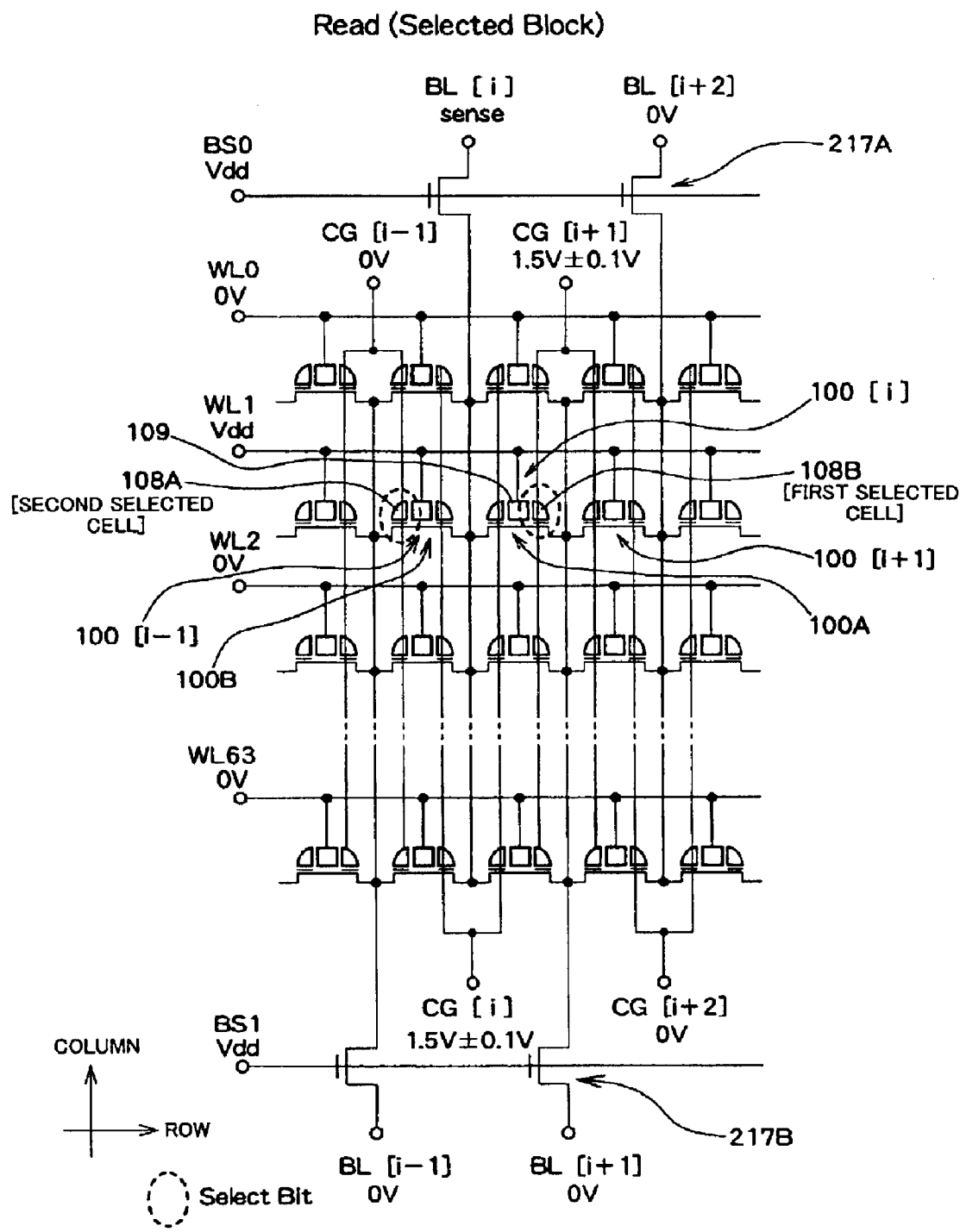
FIG. 9 is a schematic view that is illustrative of voltage setting in a selected block when data is read according to a modification of one embodiment of the present invention.

As shown in FIG. 9, one bit of the same data may be stored in two cells. In this case, the same data is stored in the first selected cell 108B of the memory cell 100A and the second selected cell 108A of the memory cell 100B adjacent in the row direction. This enables current capability to be improved, whereby an increase in speed can be achieved. Moreover, reliability of the operation of the sense amplifier can be improved. In this case, data is not stored in the memory element 108A of the memory cell 100A and the memory element 108B of the memory cell 100B. This enables the bit lines BL [i−1] and BL [i+1] to be fixed on a source side and the bit lines BL [i] and BL [i+2] to be fixed on a drain side.

The above embodiment illustrates an example in which the reverse mode is employed when reading. However, the forward mode may also be employed.

Detailed description of the program operations and erase operations of the memory cells of the non-volatile memory is omitted. If necessary, description of these operations may be found in detail in U.S. patent application Ser. No. 09/955,160 applied for by the applicant of the present invention and the like.

What is claimed is:

1. A non-volatile semiconductor memory device comprising:
    a memory cell array including a plurality of memory cells arranged in a column direction and a row direction, each of the memory cells having first and second non-volatile memory elements that are controlled by one word gate and first and second control gates, wherein:
    one of the first and second non-volatile memory elements stores data; and
    the other of the first and second non-volatile memory elements does not function as an element which stores data.

2. The non-volatile semiconductor memory device as defined in claim 1, wherein:
    in a data read mode, one of the first and second non-volatile memory elements in each of the memory cells is a selected cell and the other of the first and second non-volatile memory elements is a non-selected opposite cell; and
    a voltage equal to or lower than a power supply voltage is supplied to both the selected cell and the non-selected opposite cell.

3. The non-volatile semiconductor memory device as defined in claim 2,
    wherein a voltage applied to corresponding one of the first and second control gates of the non-selected opposite cell when data is read from the selected cell is higher than a threshold voltage in a state in which the non-selected opposite cell has no electric charge.

4. The non-volatile semiconductor memory device as defined in claim 3,
    wherein a select voltage is supplied to both the selected cell and the non-selected opposite cell when data is read from the selected cell.

5. The non-volatile semiconductor memory device as defined in claim 1, wherein:
    a bit line is connected to each of the first and second non-volatile memory elements;
    the non-volatile semiconductor memory device further comprises a driver circuit which generates a drive voltage for driving the word gate, the first and second control gates, and the bit line; and
    the driver circuit generates the drive voltage which is equal to or lower than a power supply voltage in a data read mode.

6. The non-volatile semiconductor memory device as defined in claim 1, further comprising:
    a bit line connected in common to adjacent first and second non-volatile memory elements respectively belonged to two of the memory cells which are adjacent to each other in the row direction, the bit line extending in the column direction.

7. The non-volatile semiconductor memory device as defined in claim 6,
    wherein the same data is stored in each of the adjacent first and second non-volatile memory elements in the adjacent two memory cells.

8. The non-volatile semiconductor memory device as defined in claim 7,
    wherein the bit line connected in common to the adjacent two memory cells functions as a drain line.

9. The non-volatile semiconductor memory device as defined in claim 5, wherein:
    the memory cell array is divided into a plurality of blocks in the column direction;
    a main bit line is provided across the plurality of blocks;
    the bit line is provided in each of the blocks;
    a switching element which connects and disconnects the bit line in each of the blocks and the main bit line is provided; and
    a voltage which drives the switching element in the data read mode is equal to or lower than the power supply voltage.

10. The non-volatile semiconductor memory device as defined in claim 1,
    wherein each of the first and second non-volatile memory elements has an ONO film formed of an oxide film (O), a nitride film (N), and an oxide film (O) as a charge trap site.

11. The non-volatile semiconductor memory device as defined in claim 1,
    wherein each of the memory cells stores one bit data.

* * * * *